US009113243B2

(12) United States Patent
Nielsen et al.

(10) Patent No.: US 9,113,243 B2
(45) Date of Patent: Aug. 18, 2015

(54) METHOD AND SYSTEM FOR OBTAINING AN AUDIO SIGNAL

(75) Inventors: Johan Ludvig Nielsen, Oslo (NO); Gisle Langen Enstad, Oslo (NO)

(73) Assignee: Cisco Technology, Inc., San Jose, CA (US)

( * ) Notice: Subject to any disclaimer, the term of this patent is extended or adjusted under 35 U.S.C. 154(b) by 407 days.

(21) Appl. No.: 13/587,514

(22) Filed: Aug. 16, 2012

(65) Prior Publication Data

US 2014/0050332 A1 Feb. 20, 2014

(51) Int. Cl.
*H04B 1/00* (2006.01)
*H03B 29/00* (2006.01)
*H04R 3/00* (2006.01)

(52) U.S. Cl.
CPC .......... *H04R 3/005* (2013.01); *H04R 2201/401* (2013.01); *H04R 2430/23* (2013.01)

(58) Field of Classification Search
CPC . H04R 3/005; H04R 2201/40; H04R 2430/23
USPC ........................... 381/17, 86, 92, 310; 700/94
See application file for complete search history.

(56) References Cited

U.S. PATENT DOCUMENTS 5,715,319 A * 2/1998 Chu ................................ 381/26
6,157,403 A * 12/2000 Nagata .......................... 348/171
8,649,529 B2 * 2/2014 Klefenz et al. .................. 381/92
2008/0056517 A1 * 3/2008 Algazi et al. .................. 381/310
2011/0110531 A1 * 5/2011 Klefenz et al. .................. 381/92

FOREIGN PATENT DOCUMENTS

WO WO 2010/074583 A1 7/2010
WO WO 2011/074975 A1 6/2011

OTHER PUBLICATIONS

Gerhard M. Sessler et al., "Directional Transducers", IEEE Transactions on Audio and Electroaccoustics, vol. AU-19, No. 1, pp. 19-23, Mar. 1971.

* cited by examiner

*Primary Examiner* — Simon Sing
*Assistant Examiner* — Eugene Zhao
(74) *Attorney, Agent, or Firm* — Lempia Summerfield Katz LLC

(57) ABSTRACT

A method and system for obtaining an audio signal. In one embodiment, the method comprises receiving a first sound signal at a first microphone arranged at a first height vertically above a substantially flat surface; receiving a second sound signal at a second microphone arranged at a second height vertically above the substantially flat surface; processing a signal provided by the first microphone using a low pass filter; processing a signal provided by the second microphone using a high pass filter; adding the signals processed by the low pass filter and the high pass filter to form a sum signal; and outputting the sum signal as an audio signal.

18 Claims, 8 Drawing Sheets

METHOD AND SYSTEM FOR OBTAINING AN AUDIO SIGNAL

TECHNICAL FIELD

The present disclosure generally relates to the field of electroacoustics, and more specifically to a method and system for obtaining an audio signal, whereby quality degradation caused by an acoustic obstruction is reduced.

BACKGROUND

In teleconferencing, including videoconferencing, a table microphone is often used for sound pickup and transmission. Having microphones on a top surface of a table, such as a conference table, is a typical compromise, combining sound pickup coverage and quality with easy installation.

Particular problems occur when an acoustic obstruction is located between a sound source, e.g., a speaking conference participant, and a microphone arrangement. A practical problem in teleconference scenarios is that laptop computers, which are often located in front of the conference participants, constitute an acoustic obstruction which results in quality degradation of the sound picked up by the microphone arrangement.

BRIEF DESCRIPTION OF THE FIGURES

A more complete appreciation of the present disclosure and its advantages will be readily obtained and understood when studying the following detailed description and the accompanying drawings. However, the detailed description and the accompanying drawings should not be construed as limiting the scope of the present disclosure.

DESCRIPTION OF EXAMPLE EMBODIMENTS

Overview

Figure 1A:
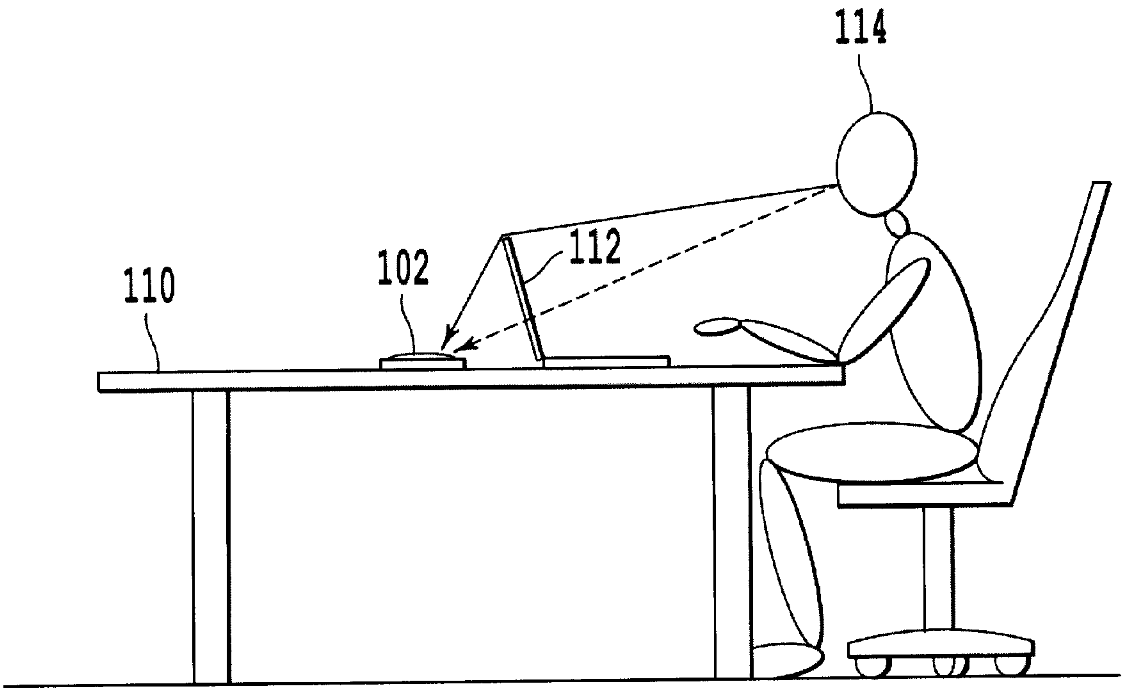
FIG. 1*a* is a diagram illustrating a shadowing effect caused by an acoustic obstruction.

In one embodiment, a method for obtaining an audio signal comprises: receiving a first sound signal at a first microphone arranged at a first height vertically above a substantially flat surface; receiving a second sound signal at a second microphone arranged at a second height vertically above the substantially flat surface; processing a signal provided by the first microphone using a low pass filter; processing a signal provided by the second microphone using a high pass filter; adding the signals processed by the low pass filter and the high pass filter to form a sum signal; and outputting the sum signal as an audio signal.

DETAILED DESCRIPTION

In the following, exemplary embodiments will be discussed with reference to the accompanying drawings, wherein like reference numerals designate identical or corresponding parts throughout the several views. Those skilled in the art will realize that other applications and modifications exist within the scope of the present disclosure as defined by the claims.

FIG. 1*a* is a diagram illustrating a shadowing effect caused by an acoustic obstruction.

FIG. 1*a* shows a substantially flat surface, which may be the surface of a conference table, illustrated at 110. A microphone 102 is arranged at the surface 110 or close above the surface 110. A sound source, e.g., a human speaker 114 participating in a videoconference or teleconference, is situated next to the surface 110. A dotted line represents sound travelling from the human speaker 114 to the microphone 102 in case of no acoustic obstruction.

Under many conditions, a microphone arranged on top of a table surface provides satisfactory performance for a videoconference or teleconference. The distance between the microphone and the speaking participant may be short, providing a high direct-to-reverberant ratio. The boundary effect (i.e., table reflection with no delay) increases the input direct sound level by 6 dB, which increases both signal-to-noise ratio and direct-to-reverberant ratio.

Further in FIG. 1*a*, a laptop computer has been illustrated as an acoustic obstruction 112, arranged in front of the human speaker 114 participating in the teleconference. Such an object placed between the human speaker 114 and the microphone 102 influences the direct sound path. Sound with wavelengths that are short compared to the object size are attenuated, while the longer waves diffract around the object. This shadowing effect is similar to a lowpass filter. For a laptop, the low pass corner frequency typically ends up between 1 and 2 kHz. This creates a muffled quality to the sound, reduces the feeling of presence, and may also reduce intelligibility in some situations.

Figure 1B:
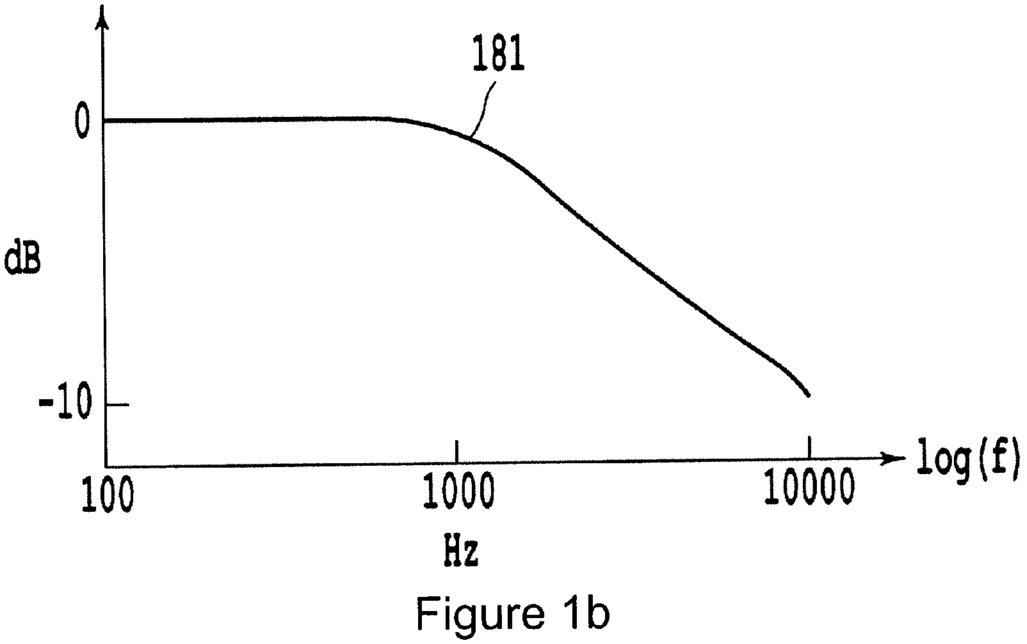
FIG. 1*b* illustrates a resulting frequency response caused by the presence of an acoustic obstruction.

FIG. 1*b* illustrates a resulting frequency response (amplitude response) 181 of the acoustic obstruction constituted by the laptop computer 112 of FIG. 1*a*. As can be seen, the response is flat up to frequencies of about 1 kHz. For higher frequencies there is an attenuation of 10 dB/decade.

Such a response may be referred to as a shadowing effect caused by the acoustic obstruction 112.

Figure 2A:
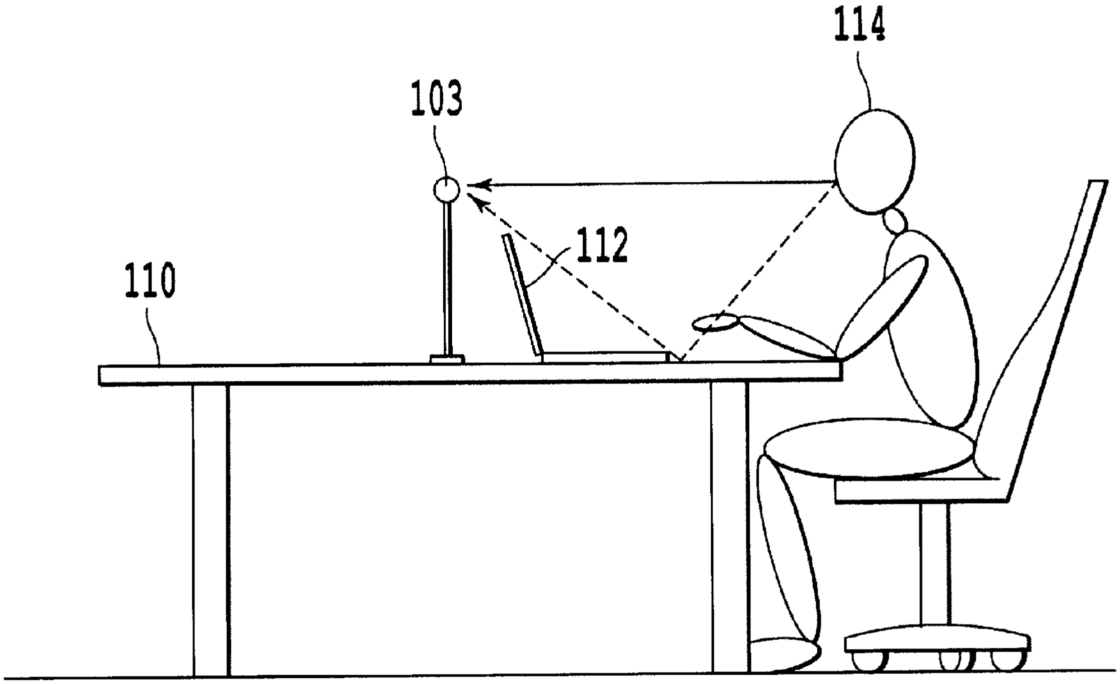
FIG. 2*a* is a diagram illustrating a comb filtering effect caused by acoustic reflection.

FIG. 2*a* is a diagram illustrating a comb filtering effect caused by acoustic reflection.

FIG. 2*a* shows again the substantially flat surface, which may be the surface of a conference table, illustrated at 110.

A sound source, e.g. a human speaker 114 participating in a teleconference, is situated next to the surface 110. An acoustic obstruction, such as a laptop computer 112, has been illustrated on the table surface 110, arranged in front of the human speaker 114.

A microphone 103 is arranged at an elevated level above the surface 110. The elevated level may, e.g., be higher than or substantially equal to the height of the acoustic obstruction 112 (e.g., a laptop computer).

Figure 2B:
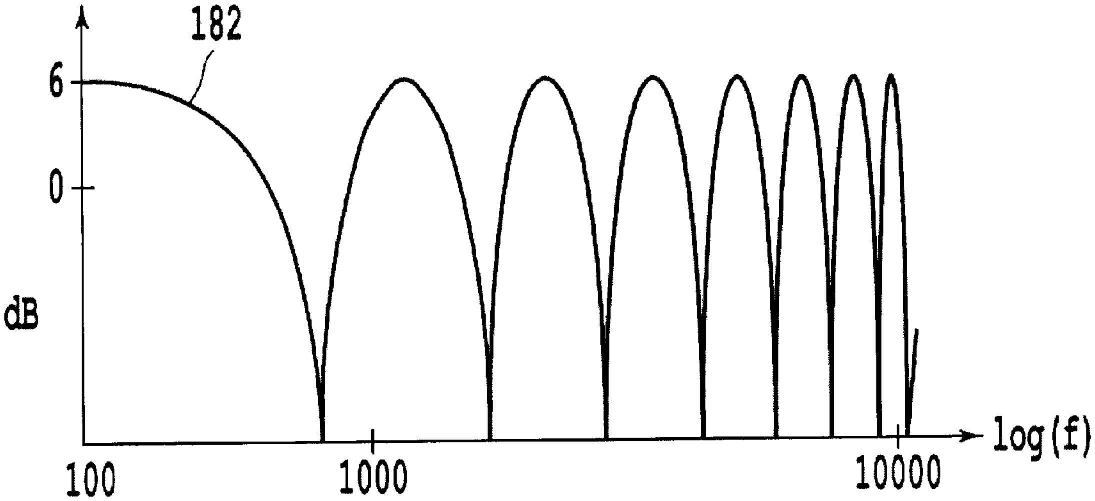
FIG. 2*b* illustrates a resulting frequency response of the arrangement illustrated in FIG. 2*a;*

FIG. 2*b* illustrates a resulting frequency response (amplitude response) 182 of the arrangement illustrated in FIG. 2*a*.

As shown in FIGS. 2*a* and 2*b*, the shadowing effect resulting from the arrangement of FIG. 1*a* has been avoided by elevating the microphone 103 above the acoustic obstruction 112 (i.e., above the top of the laptop screen). However, the arrangement illustrated in FIG. 2*a* results in a longer propagation path and delay for reflected sound from the table. For certain frequencies the additional path length results in phase reversal relative to the direct sound at the microphone, and a comb filter effect, illustrated by the comb-shaped amplitude response curve 182, occurs, which may severely compromise the sound quality. A comb filter is perceived as coloration of the sound, with words like "hollow" or "boxy" are often used as descriptors of the effect. For a typical geometry the first cancellation may occur at approximately 700 Hz, the next at approximately 2.1 kHz, and subsequent cancellations continuing on at multiples of approximately 1.4 kHz.

Figure 3:
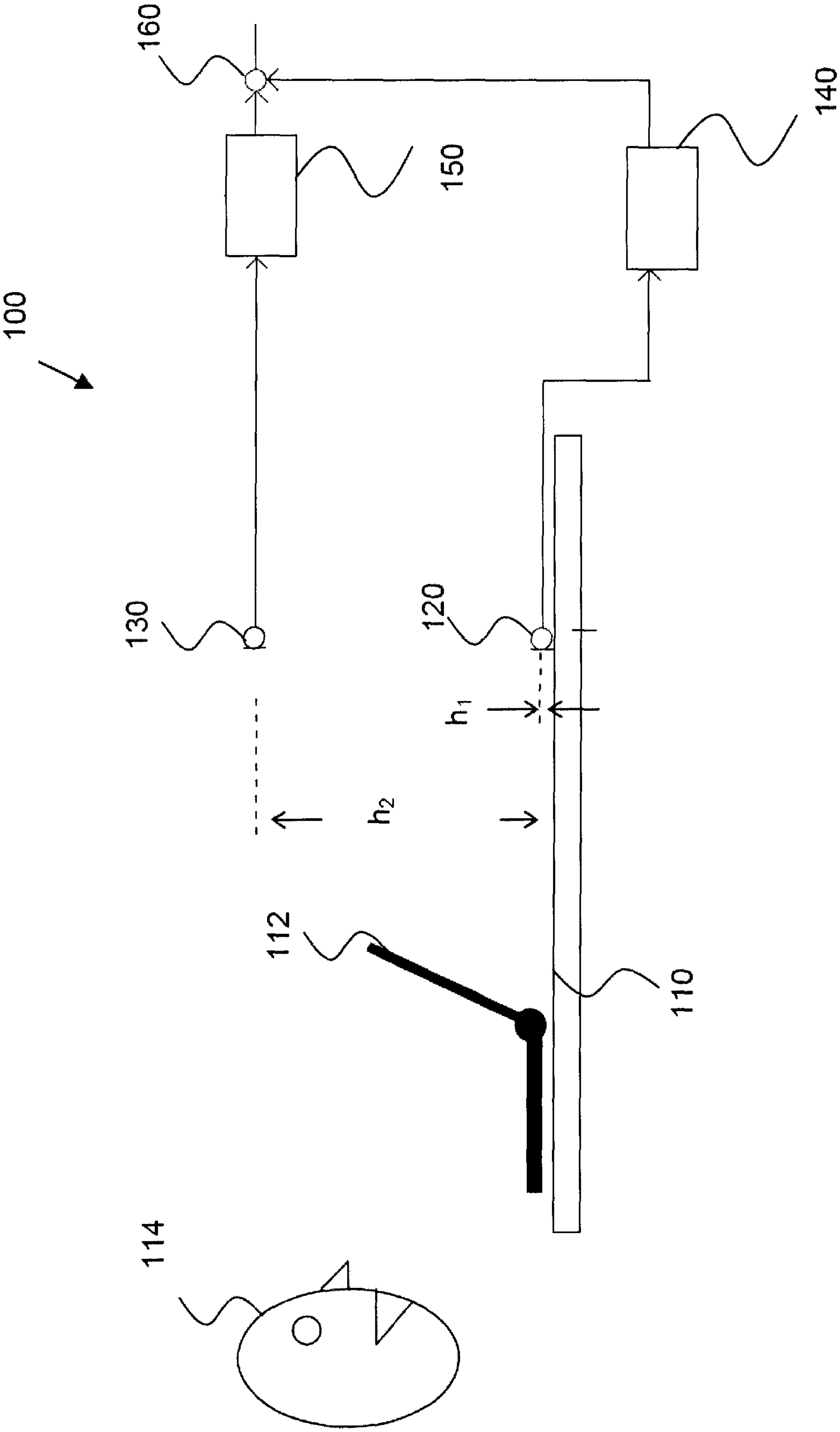
FIG. 3 is a diagram illustrating a first embodiment of a system for obtaining an audio signal in a teleconference system.

FIG. 3 is a diagram illustrating a non-limiting first embodiment of a system 100 for obtaining an audio signal in a teleconference system, whereby audio quality degradation caused by an acoustic obstruction 112 is reduced.

The term teleconference system may be understood as describing any conference system which involves transmission of at least audio data over a transmission channel or network. Alternatively, a teleconference system may be considered as any system capturing and either transmitting or recording sound that originates from a speaking conference participant in a conference room. Hence, the disclosed method and system have application in both audio conference systems such as regular telephone conference systems, and video conference systems, which transmit both audio and video.

The system 100 includes a first microphone 120, which receives a first sound signal. The first microphone is arranged at a first height $h_1$ vertically above a substantially flat surface 110.

The substantially flat surface 110 may, e.g., be the surface of a conference table. The first height $h_1$ may, e.g., be within the range of [0 mm, 40 mm], or more preferably, in the range of [0 mm, 20 mm], e.g., about 10 mm.

When selecting the first height $h_1$, it should be taken into consideration that the microphone should be within the pressure zone of the wavelengths for which the microphone is used for. One possible definition of this zone is ⅛ wavelength. With such an assumption, the first height range may, in an aspect, be dependent on the cutoff frequency of a low pass filter 140 to which the microphone is connected. Under such an assumption, a maximum value of the first height $h_1$ may be calculated as:

$$D\text{max}=c/(8*f_{LPF}), \tag{1}$$

wherein c is speed of sound in air, and $f_{LPF}$ is the cutoff frequency of the LPF 140. For a cutoff frequency $f_{LPF}$=2 kHz, a suitable range for $h_1$ becomes [0, 20 mm].

A laptop computer has been illustrated as an acoustic obstruction 112, arranged in front of a human speaker 114 participating in the teleconference. A laptop computer may constitute a substantial acoustic obstruction in a typical conference scenario. Other objects located in front of the human speaker 114, in particular objects with comparable size, height and/or shape, may of course have the same or similar effect.

The system further includes a second microphone 130, which receives a second sound signal. The second microphone is arranged at a second height $h_2$ vertically above the substantially flat surface, typically vertically above the first microphone. The second height $h_2$ may, e.g., be within the range of [10 cm, 50 cm], or preferably [25 cm, 35 cm], e.g., about 30 cm.

When selecting the second height $h_2$, it should be taken into consideration that there should be an unobstructed line between the sound source, e.g., the speaker's mouth, and the second microphone 130. In other words, the second microphone should be located at a higher level than the top of acoustic obstruction 112.

Advantageously, the second microphone 130 should also be located below the line of sight across the table to other participants.

The first microphone 120 is connected to a low pass filter 140. Hence, the low pass filter 140 is arranged to process the signal provided by the first microphone 120.

The second microphone 130 is connected to a high pass filter 150. Hence, the high pass filter 150 is arranged to process the signal provided by the second microphone 130.

The low pass filter 140 and the high pass filter 150 may have substantially the same cutoff frequency, resulting in a crossover filter pair with the cutoff frequency as its crossover frequency.

The cutoff frequency of the low pass filter 140 and the high pass filter 150, i.e., the crossover frequency of the crossover pair, may e.g., be in the range of [0.5 kHz, 3 kHz], or more preferably, in the range of [1 kHz, 1.5 kHz], e.g. about 1.2 kHz.

When selecting the crossover frequency, it should be ensured that the first, lower microphone (e.g., first microphone 120) handles the voice spectrum around the first cancellation of the comb filter that would have appeared in a one-microphone arrangement of the type illustrated in FIG. 2*a*. The second, upper microphone (e.g., second microphone 130) handles the part of the spectrum that would have been attenuated by the shadowing effect that would have resulted from a one-microphone arrangement of the type illustrated in FIG. 1*a*. Hence, design adjustments within the indicated ranges for cutoff frequencies may be made dependent on the geometry of the actual situation/arrangement and the wavelengths of the sound.

The output signals provided by the low pass filter 140 and the high pass filter 150 are added by way of an adder 160. The adder 160 provides a sum signal as the resulting audio signal. The resulting audio signal is improved with respect to quality degradation that would normally be introduced by the acoustic obstruction 112, such as a laptop computer.

The system 100 results in a two-way microphone system without a shadowing effect by an obstruction, and with much reduced comb filtering artefacts. The first microphone 120 arranged at or close to the surface 110, e.g., a table microphone, handles the spectrum up to the shadowing cutoff frequency, thereby removing the subjectively most disturbing part of the comb filter effect provided by the elevated second microphone 130. The elevated second microphone 130 manages the shadowed part of the spectrum provided by the first microphone 120.

The inventors have observed that a substantial sound quality degradation from a comb filter effect may be due to the first two dips in the amplitude response, such as the comb filter amplitude response 182 shown in FIG. 2*b*.

The subjective effect can be contributed to the close-to-logarithmic frequency resolution of the human ear and its integration of sound energy in the so-called critical bands. A high frequency critical band will contain several peaks and dips from the comb filter, effectively smoothing the perceived response. However, the lower bands will contain perhaps a single peak or dip, resulting in a large variation in perceived loudness from band to band.

Figure 4A:
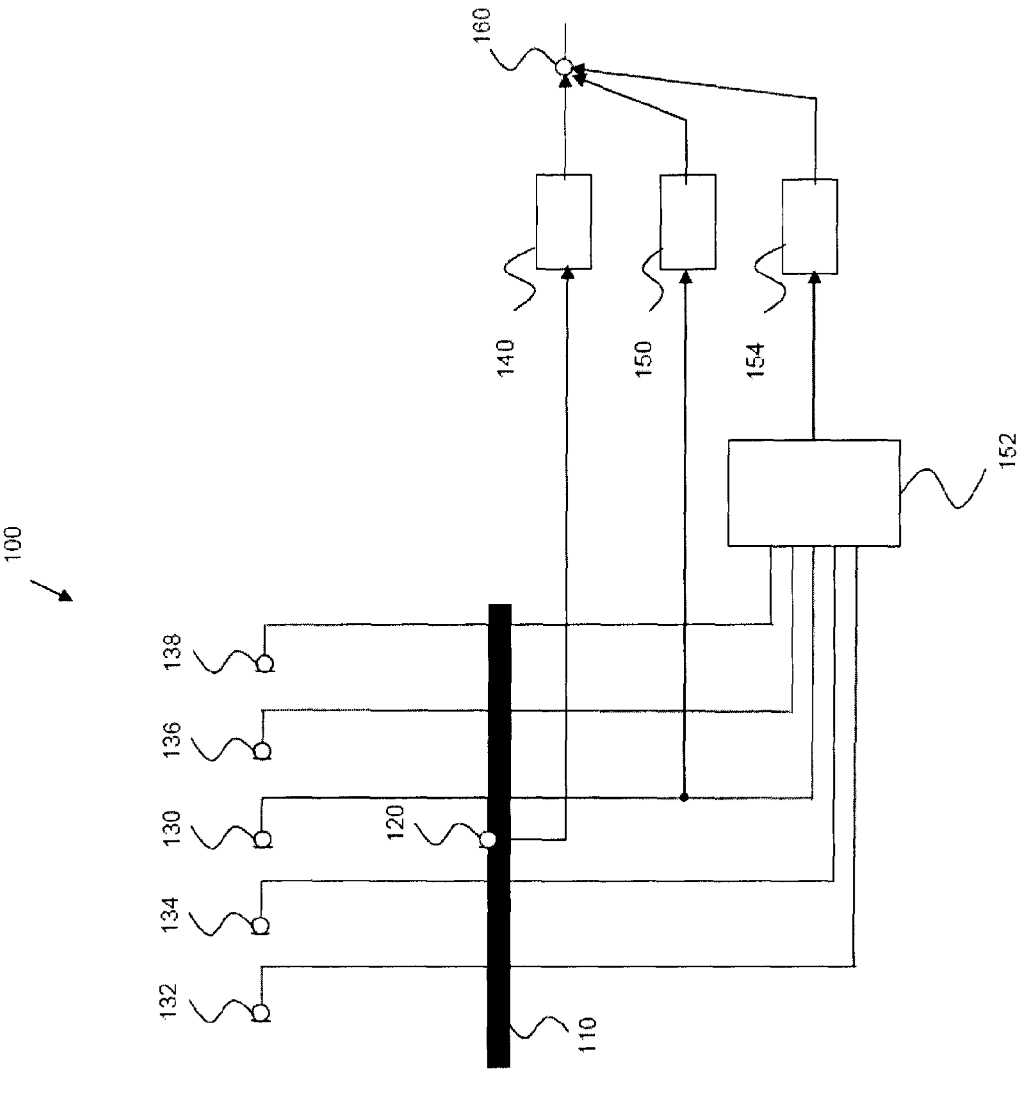
FIG. 4*a* is a diagram illustrating a second embodiment of a system for obtaining an audio signal in a teleconference system.

FIG. 4*a* is a diagram illustrating a non-limiting second embodiment of a system for obtaining an audio signal in a teleconference system.

As can be seen from the illustration, the first height (i.e., the first microphone 120's height, or first height above the surface 110) is substantially zero in this example. However, the first height may not necessarily be zero. For instance, as discussed above regarding FIG. 3, the height may be within the range of [0 mm, 40 mm], or more preferably, in the range of [0 mm, 20 mm], e.g., about 10 mm.

The second embodiment of FIG. 4*a* includes the features of the first embodiment illustrated in FIG. 3. Hence, it includes a second microphone 130 arranged at a second height above the surface 110. The second height may e.g., be as already explained with reference to FIG. 3 above.

The second embodiment further includes a third microphone, which receives a third sound signal and is arranged at the second height vertically above the substantially flat surface. Alternatively, the third microphone may be arranged at a third height that is different than the first height or the second height.

The third microphone may be a toroid microphone, i.e., a microphone having a toroid characteristic. Other characteristics are possible.

In the illustrated exemplary embodiment, the third microphone is constituted by a plurality of microphone elements 132, 134, 136 and 138, possibly also the second microphone 130, and a multi-microphone processing module 152, such as a toroid processing module 152, to which the microphone elements are connected. Hence, the output of the toroid processing module 152 is considered as the output of the third microphone. The toroid processing module may be embodied as a microprocessor device.

A toroid processing module has the function of providing toroid characteristics to an array of microphone elements. The processing in the module may include filtering, mixing, and equalization.

The output of the toroid processing module 152 is further connected to a band pass filter 154, which is arranged to process a signal provided by the third microphone.

As an alternative to the plurality of microphone elements 132, 134, 136, 138 connected to a toroid processing module 152, the third microphone may be another microphone with toroid characteristics.

Other types of multi-microphone processing modules 152 may alternatively be used. Such multi-microphone processing modules may provide a different resulting characteristic than the toroid characteristics, based on the processing of the plurality of signals from microphone elements.

The adder 160 is arranged, in this exemplary embodiment, to add the output of the low pass filter 140, the output of the high pass filter 150, and an output signal provided by the band pass filter 154.

The low pass filter 140 and the high pass filter 150 may have the same, or substantially the same, cutoff frequency. The cutoff frequency of the low pass filter 140 and the high pass filter 150, i.e., the crossover frequency of the crossover pair, may e.g., be in the range of [0.5 kHz, 3 kHz], or more preferably, in the range of [1 kHz, 1.5 kHz], e.g., about 1.2 kHz.

The band pass filter, when appropriate, may have a center frequency in the range of [1 kHz, 3 kHz], e.g., approx. 1.5 kHz, or alternatively higher. In an aspect, the cutoff frequency of the low pass filter may be as in the embodiment of FIG. 3, while the cutoff frequency of the high pass filter 150 may be moved upwards to a frequency at which the toroid implementation starts failing, which may be dependent on the spacing of the toroid microphones.

When using the bandpass filter 154, the low pass filter 140 and the lower band edge of the bandpass filter 154 may have substantially the same cutoff frequency, resulting in a crossover filter pair with the cutoff frequency as its crossover frequency. Similarly, the high pass filter 150 and the upper band edge of the bandpass filter 154 may have substantially the same cutoff frequency, resulting in a crossover filter pair with the cutoff frequency as its crossover frequency. The three filters form a three-way system covering one frequency range each with minimal overlap. The low pass filter, the high pass filter, and the band pass filter may have an order of 1, 2 or more.

Any of the filters and the toroid processing module described herein may typically be embodied as time-discrete, digital filters, e.g., FIR or IIR filters. However, they may alternatively be embodied as analog filters, such as RC, RL and/or RLC filters. As an example, digital FIR filters with reasonably high order, obtained by e.g., hundreds of taps, may be used. Any of the filters may also be embodied as a microprocessor device.

The first system embodiment, illustrated in FIG. 3, may in some cases result in a comb filter dip which occurs at a frequency where the shadowing effect from the acoustic obstruction 112 is also present. This may be further improved by the embodiment illustrated in FIG. 4*a*. Reducing the comb filter subjective effect may be done by attenuation of the table reflection to the elevated microphone.

Attenuation can be accomplished using a directive microphone system, and the toroidal pattern or microphone characteristic is well suited for a teleconference arrangement around a conference table, e.g., a round-table seating arrangement.

Implementation of toroid processing modules, e.g., in order to provide first and second-order toroid microphones by using four or five microphone elements in a plane parallel to the table has been proposed, e.g., in IEEE Transactions on Audio and Electroacoustics, Vol. AU-19, p. 19. Suitable disclosure for toroid processing modules has also been provided in WO-2010/074583 and WO-2011/074975.

A first-order toroid will attenuate the reflection less relative to higher order toroids due to the still relatively wide sound pickup angle. Therefore, a second (or higher) order toroid is preferred.

The second microphone 130 may be one of the microphone elements used for obtaining the toroid microphone, i.e., the third microphone. Alternatively, the second microphone 130 may be a separate microphone element.

Figure 4B:
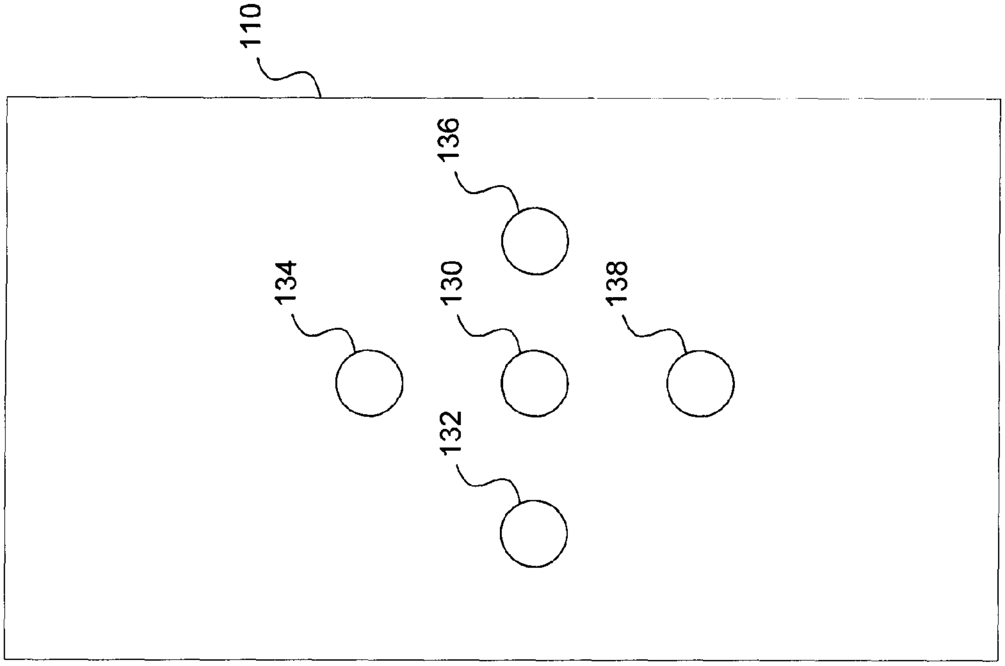
FIG. 4*b* illustrates an exemplary microphone arrangement.

Although FIG. 4*a* illustrates five microphone elements as if they were arranged in-line, the actual layout of the toroid microphone elements may advantageously be a regular cross arrangement when viewed from the top. An exemplary microphone arrangement from a top-view perspective is illustrated in FIG. 4*b*, wherein the second microphone 130, which is also an element of the toroid (i.e., third) microphone, is centrally arranged, while the remaining microphone elements 132, 134, 136, 138 are arranged symmetrically around microphone 130.

The use of a toroid has possible positive side-effects such as reducing pickup of reverberation, noise sources above the table, and handling noise from the table area. The frequency band of the toroid function should therefore be extended as far as possible. The toroid function may in certain aspects be extended upwards in frequency by adding a second toroid microphone with shorter distance between elements and therefore a higher cutoff, thereby adding a fourth frequency band to the multi-way microphone.

In an exemplary embodiment, a time delay may be added to the signals sent from any of the microphones. The time delay accounts for the difference in propagation time for sound traveling from a human speaker to microphones arranged at different heights. For example, a time delay may be added to signals sent from the microphone(s) at the second height to account for a propagation time difference relative to sound traveling to microphones at the first height.

An added time delay provides the benefit of improved audio quality and reduced frequency response problems in the crossover frequency regions. The time delay value may be in the range of [0.5 ms, 1.5 ms], and typically may be 0.75 ms, which corresponds to an extra propagation path length with a microphone at a height of 25 cm.

Figure 5:
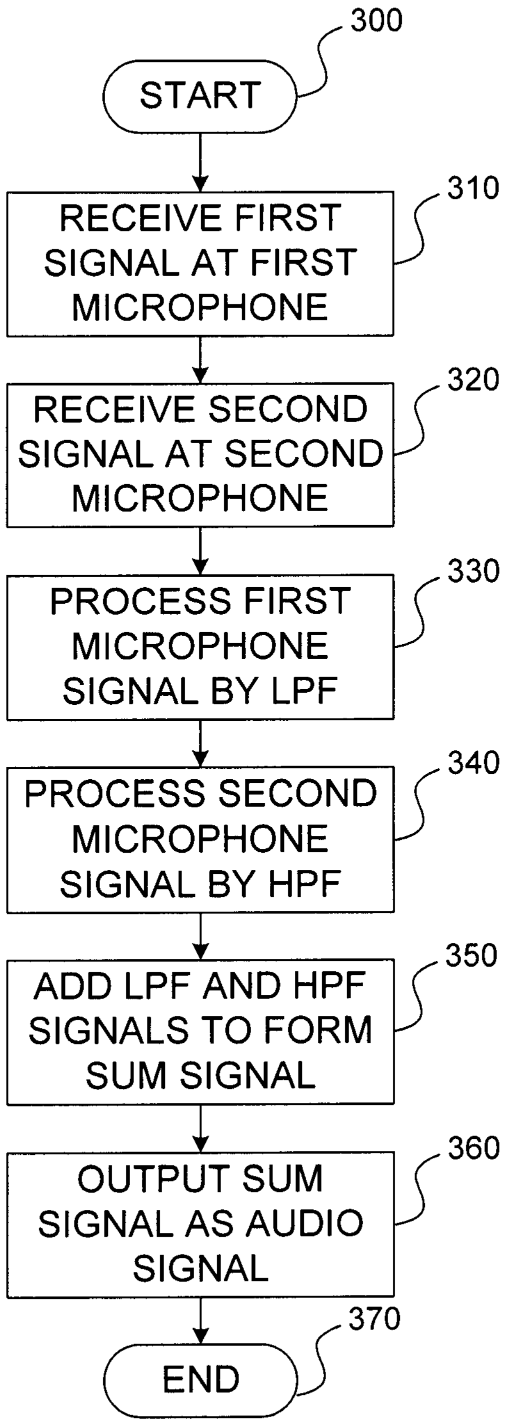
FIG. 5 is a flow chart illustrating a first embodiment of a method for obtaining an audio signal in a teleconference system.

FIG. 5 is a flow chart illustrating a first embodiment of a method for obtaining an audio signal, whereby audio quality degradation caused by an acoustic obstruction is reduced.

The method starts at the initiating step 300.

Next, in step 310, a first sound signal is received at a first microphone arranged at a first height vertically above a substantially flat surface.

Further, in step 320, a second sound signal is received at a second microphone arranged at a second height vertically above the substantially flat surface.

Further, in step 330, the signal provided by the first microphone is processed using a low pass filter.

Further, in step 340, the signal provided by the second microphone is processed using a high pass filter.

In step 350, the output signal provided by the low pass filter and the output signal provided by the high pass filter are added resulting in a sum signal.

In step 360, the sum signal is provided as the audio signal for the teleconference system.

Figure 6:
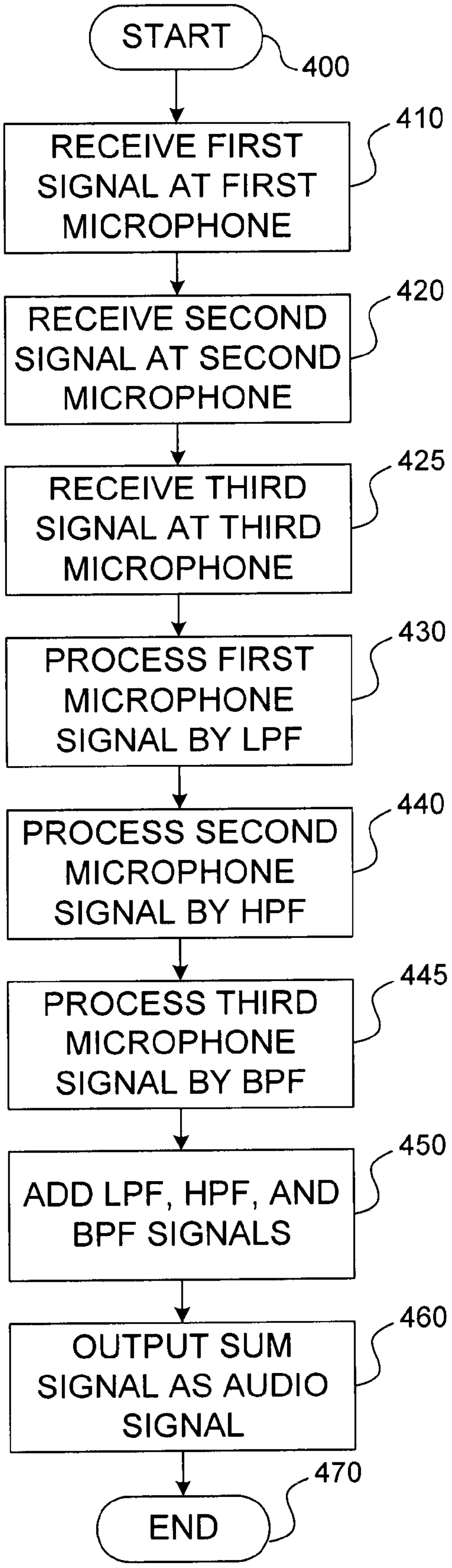
FIG. 6 is a flow chart illustrating a second embodiment of a method for obtaining an audio signal in a teleconference system.

FIG. 6 is a flow chart illustrating a second embodiment of a method for obtaining an audio signal, whereby audio quality degradation caused by an acoustic obstruction is reduced.

The method starts at the initiating step 400.

Next, in step 410, a first sound signal is received at a first microphone arranged at a first height vertically above a substantially flat surface.

Further, in step 420, a second sound signal is received at a second microphone arranged at a second height vertically above the substantially flat surface.

In step 425, a third sound signal is received at a third microphone arranged at the second height vertically above the substantially flat surface.

In step 430, the signal provided by the first microphone is processed using a low pass filter.

In step 440, the signal provided by the second microphone is processed using a high pass filter.

In step 445, a signal provided by the third microphone is processed by a band pass filter.

In step 450, the output signal provided by the low pass filter, the output signal provided by the high pass filter, and the output signal provided by the band pass filter are added, resulting in a sum signal.

In step 460, the sum signal is provided as the audio signal for the teleconference system.

In another exemplary embodiment, the third microphone, used in receiving step 425, may be a toroid microphone. The third microphone may include a plurality of microphone elements whose outputs are connected to a toroid processing module. In this case, the output signal provided by the toroid processing module forms the signal provided by the third microphone.

Further possible features of the method will be understood by means of the disclosure above with respect to the corresponding system 100, e.g., the embodiments disclosed with reference to FIGS. 3 and 4 above.

It should be understood that the described method and system are corresponding to each other, and that any feature that may have been described specifically for the method should be considered as also being disclosed with its counterpart in the description of the system, and vice versa.

Figure 7:
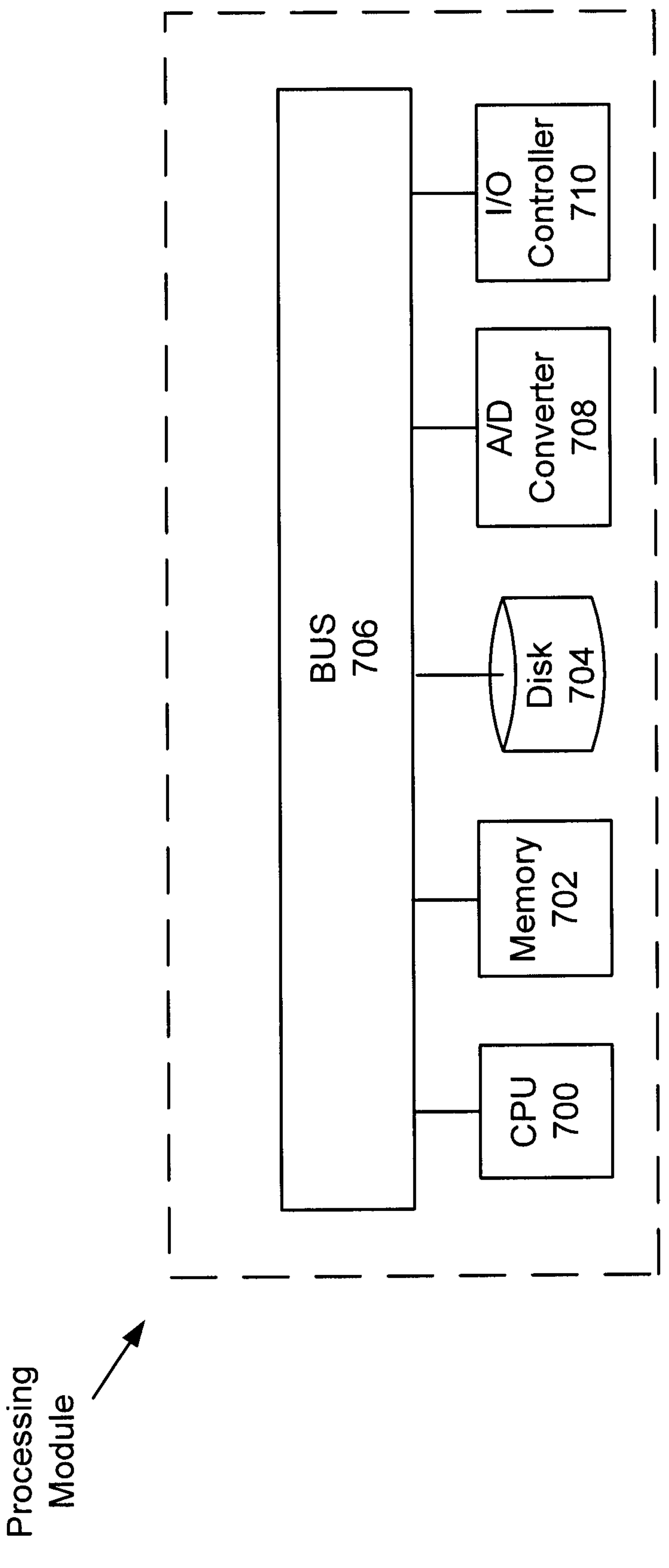
FIG. 7 is a diagram illustrating a processing module according to an exemplary embodiment.

Next, a hardware description of a processing module, such as the toroid processing module, according to an exemplary embodiment is described with reference to FIG. 7. In FIG. 7, the processing module includes a CPU 700 which performs the processes described above, e.g., for the toroid processing module and the filtering operations. The process data and instructions may be stored in memory 702. These processes and instructions may also be stored on a storage medium disk 704, such as a hard drive (HDD), read-only memory, or portable storage medium. Alternatively, the instructions may be stored remotely and communicated over a network.

CPU 700 communicates with other components of the exemplary processing module over bus 706. A/D converter 708 provides analog-to-digital conversion for the processing of signals by CPU 700. I/O controller 710 provides an interface for external communication with periphery devices and/or a network.

CPU 700 may be a Xenon or Core processor from Intel of America, an Opteron processor from AMD of America, a digital signal processor (DSP) from Texas Instruments, or may be other processor types that would be recognized by one of ordinary skill in the art. Alternatively, the CPU 700 may be implemented on an FPGA, ASIC, PLD or using discrete logic circuits, as one of ordinary skill in the art would recognize. Further, CPU 700 may be implemented as multiple processors cooperatively working in parallel to perform the instructions of the exemplary embodiment described above.

The methods of FIGS. 5 and 6 may be implemented by executing instructions stored on a computer-readable media. For example, the instructions may be stored on CDs, DVDs, in FLASH memory, RAM, ROM, PROM, EPROM, EEPROM, hard disk or any other information processing device with which the processing module communicates, such as a server or computer.

Numerous modifications and variations of the present disclosure are possible in light of the above teachings. It is therefore to be understood that within the scope of the appended claims, aspects of the present invention may be practiced otherwise than as specifically described by example herein.

The invention claimed is:

1. A method comprising:

receiving a first sound signal at a first microphone arranged at a first height vertically above a flat surface;

receiving a second sound signal at a second microphone arranged at a second height vertically above the flat surface;

receiving a third sound signal at a third microphone arranged at the second height vertically above the flat surface, wherein the third microphone has a toroid characteristic;

processing a signal provided by the first microphone using a low pass filter;

processing a signal provided by the second microphone using a high pass filter;

processing a signal provided by the third microphone by a band pass filter;

adding the signals processed by the low pass filter, the band pass filter, and the high pass filter to form a sum signal; and outputting the sum signal as an audio signal.

2. The method according to claim 1, further comprising:

receiving a third sound signal at a third microphone arranged at the second height vertically above the flat surface;

processing a signal provided by the third microphone by a band pass filter; and adding the signal processed by the band pass filter to the signals processed by the low pass filter and the high pass filter to form the sum signal.

3. The method according to claim 2, wherein the third microphone is a toroid microphone.

4. The method according to claim 2, wherein:

the third microphone includes a plurality of microphone elements whose outputs are connected to a toroid processing module, and an output signal of the toroid processing module forms the signal provided by the third microphone.

5. The method according to claim 1, wherein the first height is in a range of 0 mm to 40 mm.

6. The method according to claim 1, wherein the first height is in a range of 0 mm to 20 mm.

7. The method according to claim 1, wherein the second height is in a range of 10 cm to 50 cm.

8. The method according to claim 1, wherein the second height is in a range of 25 cm to 35 cm.

9. The method according to claim 1, wherein the low pass filter and the high pass filter each have a cutoff frequency in a range of 0.5 kHz to 3.0 kHz.

10. The method according to claim 1, wherein the low pass filter and the high pass filter each have a cutoff frequency in a range of 1.0 kHz to 1.5 kHz.

11. A system comprising:

a first microphone, which receives a first sound signal, arranged at a first height vertically above a flat surface;

a second microphone, which receives a second sound signal, arranged at a second height vertically above the flat surface;

a third microphone, which receives a third sound signal, arranged at the second height above the flat surface, wherein the third microphone is a toroid microphone;

a low pass filter configured to process a signal provided by the first microphone;

a bandpass filter configured to process a signal provided by the third microphone;

a high pass filter configured to process a signal provided by the second microphone; and an adder configured to add an output signal provided by the low pass filter, an output signal provided by the band pass filter, and an output signal provided by the high pass filter to form a sum signal output as an audio signal.

12. The system according to claim 11, wherein the third microphone includes a plurality of microphone elements whose outputs are connected to a toroid processing module, and an output signal of the toroid processing module forms the signal provided to the band pass filter by the third microphone.

13. The system according to claim 11, wherein the first height is in a range of 0 mm to 40 mm.

14. The system according to claim 11, wherein the first height is in a range of 0 mm to 20 mm.

15. The system according to claim 11, wherein the second height is in a range of 10 cm to 50 cm.

16. The system according to claim 11, wherein the second height is in a range of 25 cm to 35 cm.

17. The system according to claim 11, wherein the low pass filter and the high pass filter each have a cutoff frequency in a range of 0.5 kHz to 3.0 kHz.

18. The system according to claim 11, wherein the low pass filter and the high pass filter each have a cutoff frequency in a range of 1.0 kHz to 1.5 kHz.

* * * * *